US009716468B2

(12) United States Patent
Hossain et al.

(10) Patent No.: US 9,716,468 B2
(45) Date of Patent: Jul. 25, 2017

(54) INTEGRATED CIRCUIT COMPRISING FRACTIONAL CLOCK MULTIPLICATION CIRCUITRY

(71) Applicant: Rambus Inc., Sunnyvale, CA (US)

(72) Inventors: Masum Hossain, Sunnyvale, CA (US); Farshid Aryanfar, Sunnyvale, CA (US); Mohammad Hekmat, Mountain View, CA (US); Reza Navid, San Francisco, CA (US)

(73) Assignee: RAMBUS INC., Sunnyvale, CA (US)

( * ) Notice: Subject to any disclaimer, the term of this patent is extended or adjusted under 35 U.S.C. 154(b) by 0 days.

(21) Appl. No.: 14/960,065

(22) Filed: Dec. 4, 2015

(65) Prior Publication Data

US 2016/0190986 A1 Jun. 30, 2016

Related U.S. Application Data

(63) Continuation of application No. 14/482,782, filed on Sep. 10, 2014, now Pat. No. 9,236,834, which is a continuation of application No. 13/686,175, filed on Nov. 27, 2012, now Pat. No. 8,854,091.

(60) Provisional application No. 61/563,973, filed on Nov. 28, 2011.

(51) Int. Cl.
| H03B 19/00 | (2006.01) |
| H03K 5/00 | (2006.01) |
| H03K 3/03 | (2006.01) |
| G06F 1/08 | (2006.01) |
| H03L 7/099 | (2006.01) |
| G06F 1/10 | (2006.01) |

(52) U.S. Cl.
CPC ............... *H03B 19/00* (2013.01); *G06F 1/08* (2013.01); *G06F 1/10* (2013.01); *H03K 3/0315* (2013.01); *H03K 5/00006* (2013.01); *H03L 7/099* (2013.01)

(58) Field of Classification Search
CPC .... H03K 3/0315; H03K 3/0322; H03B 19/00; H03L 7/24
USPC .................................. 327/113, 115, 116, 117
See application file for complete search history.

(56) References Cited

U.S. PATENT DOCUMENTS

| 6,535,037 B2 | 3/2003 | Maligeorgos |
| 7,952,438 B2 | 5/2011 | Song et al. |
| 8,854,091 B2 | 10/2014 | Hossain et al. |
| 8,860,513 B1 * | 10/2014 | Chong ................ H03K 3/0322 331/172 |
| 9,018,987 B1 * | 4/2015 | Lahiri ................ H03K 3/0315 327/114 |

(Continued)

OTHER PUBLICATIONS

Adler, Robert, "A Study of Locking Phenomena in Oscillators," Jun. 1946, Proceedings of the I.R.E, and Waves and Electrons, p. 351-357. 7 pages.

(Continued)

*Primary Examiner* — John Poos
(74) *Attorney, Agent, or Firm* — Park, Vaughan, Fleming & Dowler LLP; Laxman Sahasrabuddhe

(57) ABSTRACT

Circuitry capable of performing fractional clock multiplication by using an injection-locked oscillator is described. Some embodiments described herein perform fractional clock multiplication by periodically changing the injection location, from a set of injection locations, where the injection signal is injected and/or by periodically changing a phase, from a set of phases, of the injection signal that is injected into the ILO.

20 Claims, 13 Drawing Sheets

(56) References Cited

U.S. PATENT DOCUMENTS

| | | | |
|---|---|---|---|
| 9,564,880 B2* | 2/2017 | Stengel | H03K 3/0315 |
| 2005/0157577 A1 | 7/2005 | Barth, Jr. et al. | |
| 2009/0167441 A1 | 7/2009 | Song et al. | |
| 2009/0175116 A1* | 7/2009 | Song | G11C 7/22 365/233.12 |
| 2010/0085123 A1 | 4/2010 | Frans et al. | |
| 2011/0187420 A1 | 8/2011 | Kuo et al. | |
| 2014/0043105 A1* | 2/2014 | Zerbe | H03K 3/0322 331/50 |
| 2015/0188554 A1* | 7/2015 | Chong | H03K 3/0231 327/158 |

OTHER PUBLICATIONS

Albonesi et al., "MCD: A Multiple Clock Domain Microarchitecture," Slides, ICS 2002 minimally clocked processor design tutorial. 43 pages.

Carusone, Tony Chan, "Injection-Locking for High-Speed Wireline Communication," University of Toronto, Apr. 15, 2010. 14 pages.

Casper et al., "A 20Gb/s Forwarded Clock Transceiver in 90nm CMOS," 4.6, ISSCC 2006 Session 4. 10 pages.

Clark et al., "An Embedded 32-b Microprocessor Core for Low-Power and High-Performance Applications," Nov. 2001, IEEE Journal of Solid-State Circuits, vol. 36, No. 11, pp. 1599-1608. 10 pages.

Farjad-Rad, Ramin et al., "A 33-mW 8-Gb/s CMOS Clock Multiplier and CDR for Highly Integrated I/Os," IEEE Journal of Solid-State Circuits, vol. 39, No. 9, Sep. 2004, pp. 1553-1561. 9 pages.

Fischer et al., "A 90-nm Variable Frequency Clock System for a Power-Managed Itanium Architecture Processor," Jan. 2006, IEEE Journal of Solid-State Circuites, vol. 41, No. 1, pp. 218-228. 11 pages.

Hara, Shoichi et al., "10MHzto 7GHz Quadrature Signal Generation Using a Divide-by-4/3, -3/2, -5/3, -2, -5/2, -3, -4, and -5 Injection-Locked Frequency Divider," 2010 Symposium on VLSI Circuits/ Technical Digest of Technical Papers. 2 pages.

Hossain, et al., "5-10 Gb/s 70 mW Burst Mode AC Coupled Receiver in 90-nm CMOS," IEEE Journal of Solid-State Circuits, vol. 45, No. 3, Mar. 2010, p. 524-537. 14 pages.

Hossain, Masum et al., "A 6.8mW 7.4Gb/s Clock-Forwarded Receiver with up to 300MHz Jitter Tracking in 65nm CMOS," ISSCC 2010, Session 8, High-Speed Wireline Transceivers 8.2, p. 158-160. 3 pages.

Hossain, Masum et al., "CMOS Oscillators for Clock Distribution and Injection-Locked Deskew," IEEE Journal of Solid-State Circuits, vol. 44, No. 8, pp. 2138-2153, Aug. 2009. 16 pages.

Hu et al., "A 0.6mW/Gbps, 6.4-8.0Gbps Serial link Receiver Using Local Injection-Locked Ring Oscillators in 90nm CMOS," 2009 Symposium on VLSI Circuits Digest of Technical Papers. 2 pages.

Hu, Kangmin et al., "A 0.6 mW/Gb/s, 6.4-7.2 Gb/s Serial Link Receiver Using Local Injection-Locked Ring Oscillators in 90 nm CMOS," IEEE Journal of Solid-State Circuits, vol. 45, No. 4, Apr. 2010, pp. 899-908. 10 pages.

Jaussi et al., "A 20Gb/s Embedded Clock Transceiver in 90n CMOS," 18.8, ISSCC 2006 Session 18. 10 pages.

Lai et al., "Capturing Oscillator Injection Locking via Nonlinear Phase-Domain Macromodels," IEEE Transactions on Microwave Theory and Techniques, vol. 52, No. 9, Sep. 2004, p. 2251-2261. 11 pages.

Lee, Jri et al., "Paper 5.2: Subharmonically Injection-Locked PLLs for Ultra-Low-Noise Clock Generation," Slides, 2009 IEEE International Solid-State Circuits Conference. 32 pages.

Lee, Jri et al., "Subharmonically Injection-Locked PLLs for Ultra-Low-Noise Clock Generation," ISSCC 2009, Session 5, 5.2, pp. 91-93. 3 pages.

Liu, Yao-Hong et al., "A Wideband PLL-Based G/FSK Transmitter in 0.18 um CMOS," dated Sep. 1, 2009, IEEE Journal of Solid-State Circuits, vol. 44, No. 9. 11 pages.

Maffezzoni, Paolo, "Analysis of Oscillator Injection Locking Through Phase-Domain Impulse-Response," IEEE Transactions on Circuits and Systems—I: Regular Papers, vol. 55, No. 5, Jun. 2008, p. 1297-1305. 9 pages.

Mahony et al., "A 27Gb/s Forwarded-Clock I/O Receiver Using an Injection-Locked LC-DCO in 45nm CMOS," 25.1, ISSCC 2008 Session 25, p. 452-453, 627. 3 pages.

Mirzaei, Ahmad et al., "Multi-Phase Injection Widens Lock Range of Ring-Oscillator-Based Frequency Dividers," IEEE Journal of Solid-State Circuits, vol. 43, No. 3, Mar. 2008, pp. 656-671. 16 pages.

Ng et al. "A Second-Order Semidigital Clock Recovery Circuit Based on Injection Locking", IEEE Journal of Solid-State Circuits, vol. 38 No. 12, Dec. 2003, pp. 2101-2110, plus corresponding ISSCC 2003 Session 4 paper 4.3, 18 pages.

O'Mahony et al., "Paper 25.1: A 27Gb/s Forwarded-Clock I/O Receiver using an Injection-Locked LC-DCO in 45nm CMOS," IEEE International Solid-State Circuits 2008. 39 pages.

O'Mahony, Frank et al. "A Programmable Phase Rotator based on Time-Modulated Injection-Locking" 2010 IEEE Symposium on VLSI Circuits (VLSIC), Honolulu, HI, Jun. 16-18, 2010, pp. 45-46. 2 pages.

Paciorek, L.J., "Injection Locking of Oscillators," Nov. 1965, Proceedings of the IEEE, vol. 53, No. 11, p. 1723-1728. 6 pages.

Rategh, H.R., et al., "Superharmonic Injection-Locked Frequency Dividers," IEEE Journal of Solid-State Circuits, 34(6): 813-821 (Jun. 1999), 9 pages.

Razavi, Behzad, "A Study of Injection Locking and Pulling in Oscillators," IEEE Journal of Solid-State Circuits, vol. 39, No. 9, Sep. 2004, p. 1415-1424. 10 pages.

Shekhar, Sudip et al., "Strong Infection Locking in Low-Q LC Oscillators: Modeling and Application in a Forwarded-Clock I/O receiver," IEEE Transactions on Circuits and Systems—I: Regular Papers, vol. 56, No. 8, Aug. 2009, pp. 1818-1829. 12 pages.

Tierno et al., "A Wide Power Supply Range, Wide Tuning Range, All Static CMOS All Digital PII in 65 nm SOI," Jan. 2008, IEEE Journal of Solid-State Circuits, vol. 43, No. 1, pp. 42-51. 10 pages.

Vanassche, et al., "On the Difference between Two Widely Publicized Methods for Analyzing Oscillator Phase Behavior," 2002, IEEE, p. 229-233. 5 pages.

Zhang, Lin et al., "Infection-Locked Clocking: A New GHz Clock Distribution Scheme," IEEE 2006 Custom Integrated Circuits Conference (CICC), pp. 785-788. 4 pages.

* cited by examiner

INTEGRATED CIRCUIT COMPRISING FRACTIONAL CLOCK MULTIPLICATION CIRCUITRY

RELATED APPLICATION

This application is a continuation of, and claims priority to, U.S. application Ser. No. 14/482,782, having the same title and inventors as the instant application, filed 10 Sep. 2014, which is herein incorporated by reference in its entirety for all purposes. U.S. application Ser. No. 14/482,782 is a continuation of, and claims priority to, U.S. application Ser. No. 13/686,175 (U.S. Pat. No. 8,854,091), having the same title and inventors as the instant application, filed 27 Nov. 2012, which is herein incorporated by reference in its entirety for all purposes. U.S. application Ser. No. 13/686,175 is a non-provisional of, and claims priority to, U.S. Provisional Application No. 61/563,973, having the same title and inventors as the instant application, filed 28 Nov. 2011, which is herein incorporated by reference in its entirety for all purposes.

BACKGROUND

This disclosure generally relates to electronic circuits. An integrated circuit (IC) may include one or more clock domains, each having a clock signal. In some applications, the frequency of the clock signal may need to be changed.

DETAILED DESCRIPTION

Some embodiments presented in this disclosure feature circuitry capable of performing fractional clock multiplication by using an ILO. Specifically, some embodiments described herein perform fractional clock multiplication by periodically changing the injection location of the ILO where the injection signal is injected and/or by periodically changing a phase of the injection signal.

Some embodiments of the fractional clock multiplication circuitry described herein are capable of switching the clock frequency faster than other approaches for performing fractional clock multiplication, e.g., approaches based on a phase-locked loop (PLL) or a delay-locked loop (DLL). Specifically, some embodiments described herein are capable of switching the clock frequency in less than or equal to 10 ns. According to one definition, a fractional clock multiplier switches to a target frequency when the fractional clock multiplier begins outputting a clock signal whose frequency is substantially constant and whose frequency is substantially equal to the target frequency, and optionally whose phase is substantially equal to a desired clock phase.

Figure 1A:
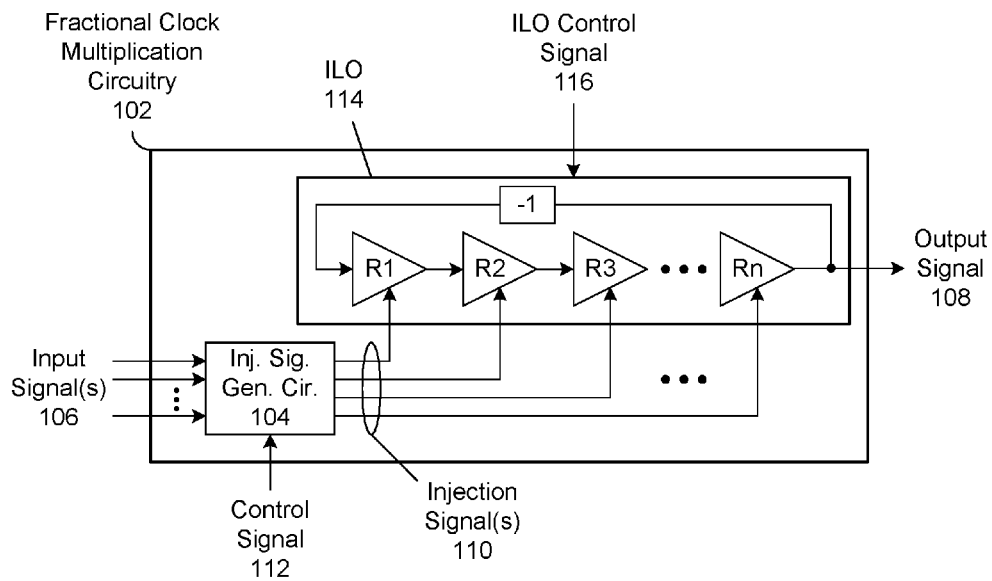
FIG. 1A illustrates circuitry capable of performing fractional clock multiplication by using an injection-locked oscillator (ILO) in accordance with some embodiments described herein.

FIG. 1A illustrates circuitry capable of performing fractional clock multiplication by using an ILO in accordance with some embodiments described herein.

In some embodiments described herein, fractional clock multiplication circuitry 102 can receive one or more input signal(s) 106, and generate output signal 108. The ratio between the frequency of input signal(s) 106 and output signal 108 can be an integer or a fraction (e.g., 0.4, 0.8, 1.0, 1.4, 2.5, 3.0, etc.).

In some embodiments described herein, input signal(s) 106 contains a single master clock signal. In other embodiments described herein, input signal(s) 106 contains multiple copies of a master clock signal which have the same frequency, but which have different phases.

In some embodiments described herein, fractional clock multiplication circuitry 102 can include ILO 114, and injection signal generation circuitry 104. ILO 114 may have multiple delay elements R1-Rn that are arranged in a loop. The output from one of the delay elements can be provided as output signal 108. A delay element in the loop may or may not invert its input signal. However, the loop inverts the signal. The fact that the delay loop inverts the signal is illustrated in the figures of this disclosure by using a rectangular box with a "−1" written inside the box. The rectangular box may not correspond to an actual circuit element, and the value written inside the rectangular box may not correspond to the actual gain of the loop. In some embodiments, the rectangular box with a "−1" written inside the box may represent that the loop has an odd number of single-ended delay elements that invert the signal. In some embodiments, the rectangular box with a "−1" written inside the box may represent that the differential outputs of an odd number of differential delay elements are provided, with reverse polarity, to the next differential delay element in the loop.

Injection signal generation circuitry 104 can generate one or more injection signal(s) 110 based on input signal(s) 106. Injection signal(s) 110 can be injected into one or more injection locations (e.g., delay elements) in ILO 114. In some embodiments described herein, injection signal generation circuitry 104 can perform fractional clock multiplication by periodically changing the injection location where the injection signal is injected and/or by periodically changing a phase of the injection signal.

Injection signal generation circuitry 104 can optionally receive control signal 112 which can be used to modify the fractional clock multiplication ratio between the frequency of output signal 108 and the frequency of input signal(s) 106.

ILO 114 may optionally receive ILO control signal 116 which may be used to modify the delay of the delay elements R1-Rn, thereby modifying the natural oscillation frequency of ILO 114. In some embodiments described herein, ILO control signal 116 may be used to ensure that the natural oscillation frequency of ILO 114 remains substantially constant even when the operating conditions (e.g., temperature and/or voltage) change.

The delay elements in some of the figures of this disclosure have been shown as single-ended delay elements for the sake of clarity. However, it will be apparent to those skilled in the art that the single-ended delay elements may be replaced with differential delay elements.

Figure 1B:
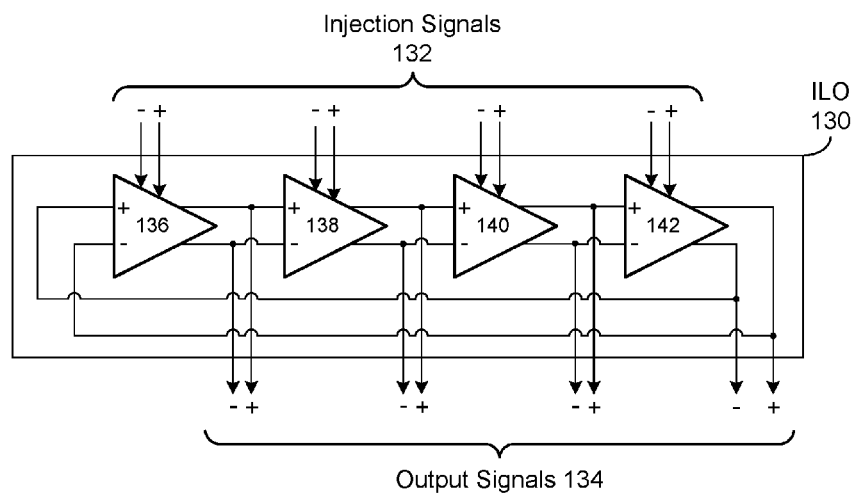
FIG. 1B illustrates a four-stage ILO in accordance with some embodiments described herein.

FIG. 1B illustrates a four-stage ILO in accordance with some embodiments described herein. The four-stage ILO shown in FIG. 1B can correspond to an embodiment of ILO 114 shown in FIG. 1A.

ILO 130 can include delay elements 136-142 arranged in a loop. As shown in FIG. 1B, each delay element may receive differential signals from the previous delay element in the loop and output differential signals that are provided as inputs to the next delay element in the loop. In some embodiments, an odd number of stages of the ILO may invert the signal. For example, as shown in FIG. 1B, the differential outputs of delay element 142 are provided to the opposite polarity inputs of delay element 136 (e.g., the "+" and "−" outputs of delay element 142 can be coupled with the "−" and "+" inputs of delay element 136, respectively). Output signals 134 from the delay elements can be used to generate the output signal of ILO 130. In some embodiments, the output of one of the delay elements can be provided as an output of ILO 130. In some embodiments, the outputs from multiple delay elements can be provided as inputs to a multiplexer or blender, and the output of the multiplexer or blender can be provided as the output of ILO 130.

Figure 1C:
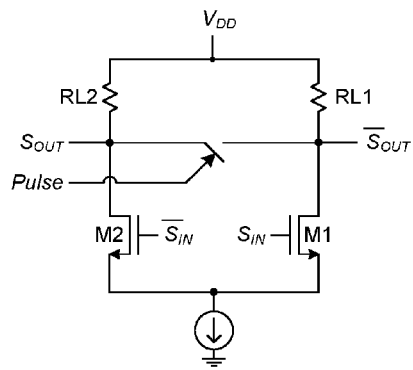
FIG. 1C illustrates a delay element of an ILO in accordance with some embodiments described herein.

FIG. 1C illustrates a delay element of an ILO in accordance with some embodiments described herein.

As shown in FIG. 1C, a delay element can include differential transistor pair M1 and M2 which can receive the differential input signal $S_{IN}$ and $\overline{S}_{IN}$ as input. RL1 and RL2 can be load resistances, and $V_{DD}$ can be the supply voltage. The drains of transistors M1 and M2 can be coupled with a switch that is controlled by the injection signal, which is illustrated as "Pulse" in FIG. 1C. In the embodiment shown in FIG. 1C, the injection signal is not a differential signal.

Figure 1D:
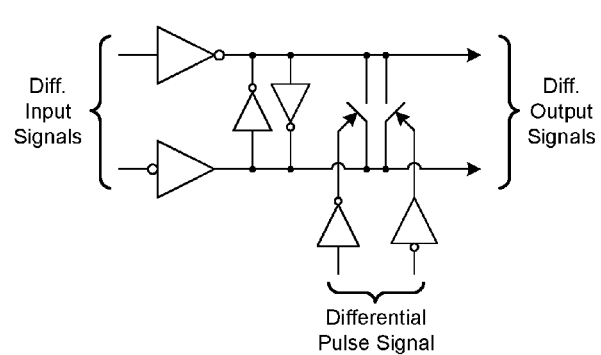
FIG. 1D illustrates a delay element of an ILO in accordance with some embodiments described herein.

FIG. 1D illustrates a delay element of an ILO in accordance with some embodiments described herein. The delay element illustrated in FIG. 1D can correspond to a delay element shown in FIG. 1B, e.g., delay element 136.

The circuitry shown in FIG. 1D can receive differential input signals and produce differential output signals. As shown in FIG. 1D, differential pulse signals can be provided to the switches.

Various modifications to the disclosed embodiments will be readily apparent to those skilled in the art, and the general principles defined herein may be applied to other embodiments and applications without departing from the spirit and scope of the present disclosure. Some variations and modifications of the embodiments illustrated in FIG. 1A-1D are described below.

Figure 2A:
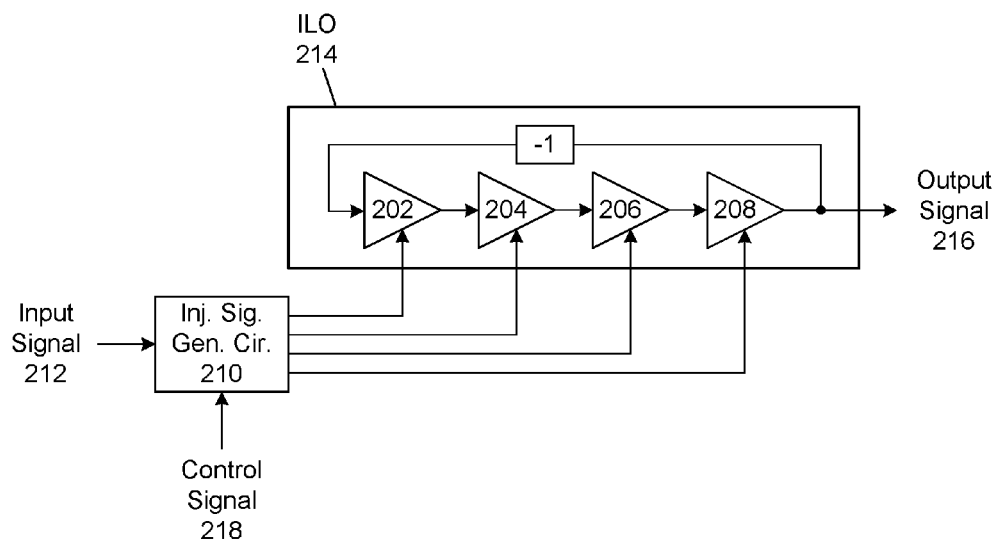
FIG. 2A illustrates circuitry capable of performing fractional clock multiplication by using an ILO in accordance with some embodiments described herein.

FIG. 2A illustrates circuitry capable of performing fractional clock multiplication by using an ILO in accordance with some embodiments described herein. FIG. 2A can correspond to an embodiment of fractional clock multiplication circuitry 102 shown in FIG. 1A.

ILO 214 includes four delay elements 202-208 that are arranged in a loop. The output of delay element 208 is provided as output signal 216. Injection signal generation circuitry 210 can receive input signal 212 (e.g., a master clock signal). The outputs from injection signal generation circuitry 210 can be injected into delay elements 202-208. Injection signal generation circuitry 210 can also receive control signal 218 that can be used to control the fractional clock multiplication ratio, i.e., the ratio between the frequency of input signal 212 and the frequency of output signal 216.

The embodiment illustrated in FIG. 2A can perform fractional clock multiplication by periodically changing the injection location where the injection signal is injected. In general, injection signal generation circuitry 210 can inject the injection signal into different injection locations in any given order. For example, in successive clock cycles of input signal 212, injection signal generation circuitry 210 can inject the injection signal into delay elements 202, 204, 206, 208, and then wrap around to delay element 202. In another example, injection signal generation circuitry 210 can alternate between delay elements 202 and 206. In yet another example, injection signal generation circuitry 210 can inject the injection signal in reverse order, e.g., injection signal generation circuitry 210 may inject the injection signal into delay elements 208, 206, 204, etc. in successive clock cycles.

Figure 2B:
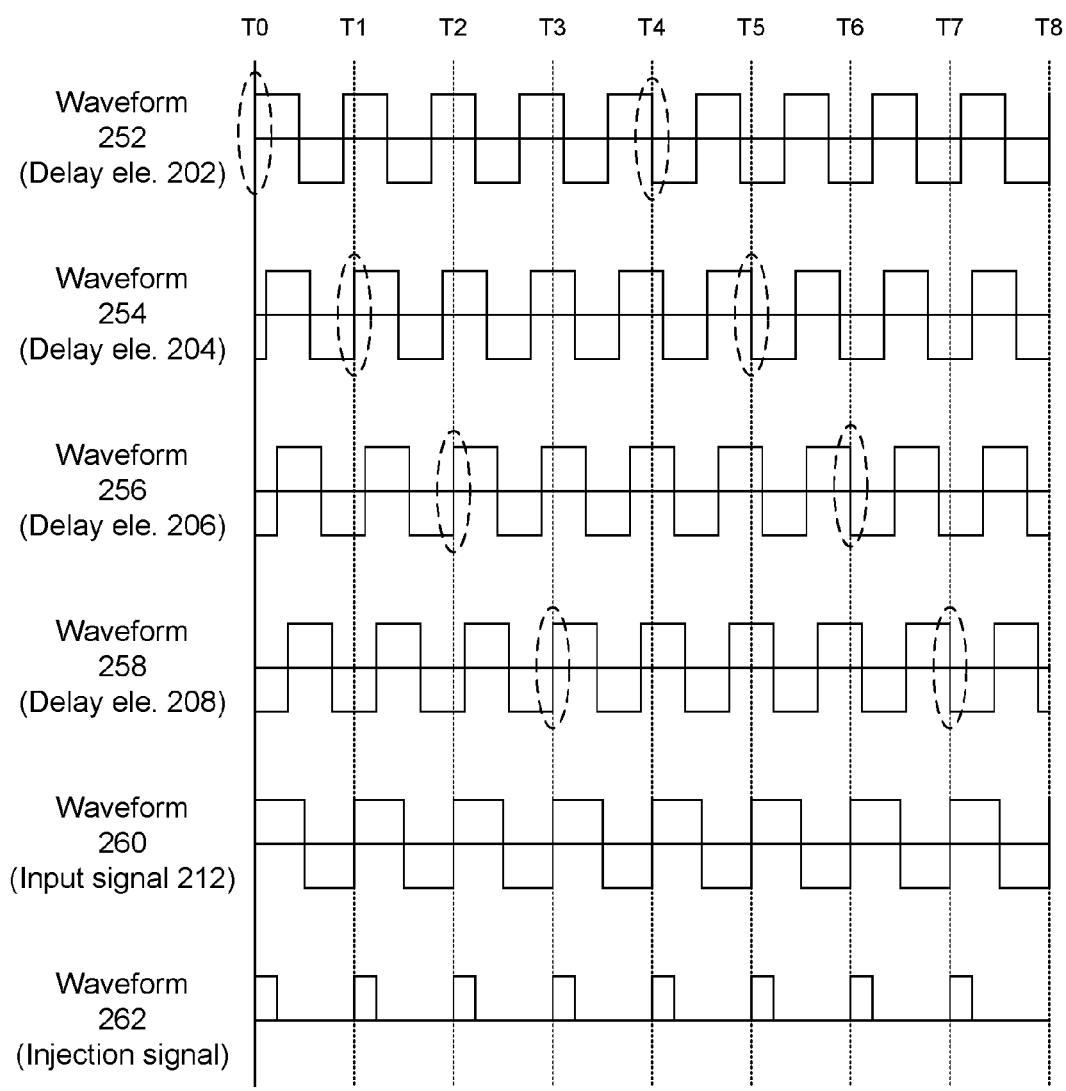
FIG. 2B illustrates some waveforms associated with the circuitry shown in FIG. 2A in accordance with some embodiments described herein.

FIG. 2B illustrates some waveforms associated with the circuitry shown in FIG. 2A in accordance with some embodiments described herein.

Waveforms 252, 254, 256, and 258 can correspond to the inputs of delay elements 202, 204, 206, and 208, respectively. Waveform 252 can also correspond to an inverted version of output signal 216 since an inverted version of the output of delay element 208 is provided as an input to delay element 202. Waveform 260 can correspond to input signal 212, and waveform 262 can correspond to the injection signal that is generated from input signal 212.

Fractional clock multiplication can be achieved by periodically changing the injection location. In one example, the injection location can be changed as follows: at time T0, inject the injection signal (shown by waveform 262) into delay element 202; at time T1, inject the injection signal into delay element 204; at time T2, inject the injection signal into delay element 206; at time T3, inject the injection signal into delay element 208; at time T4, wrap around and inject the injection signal into delay element 202; and so forth.

When the injection signal is injected in this manner, the edges in waveforms 252-258 line up with the injection pulses in waveform 262 as follows: at time T0, the injection signal pulse in waveform 262 is aligned with a corresponding positive edge in waveform 252; at time T1, the injection signal pulse in waveform 262 is aligned with a corresponding positive edge of waveform 254; at time T2, the injection signal pulse in waveform 262 is aligned with a corresponding positive edge of waveform 256; and, at time T3, the injection signal pulse in waveform 262 is aligned with a corresponding positive edge of waveform 258. The edges in waveforms 252-258 that line up with the injection signal pulses are highlighted using dashed ovals. This alignment pattern repeats for T4-T7, except that the alignment is with negative edges instead of positive edges. (At time instances T4-T7, an inverted version of the injection signal may be injected into the delay elements so that the negative edges of waveforms 252-258 line up with the inverted injection signal.)

The ratio between the frequency of input signal 212 (which corresponds to waveform 260) and the frequency of output signal 216 (which corresponds to an inverted version of waveform 252) is a fraction. In some embodiments, the fractional clock multiplication ratio is given by $$\frac{f_2}{f_1} = \frac{2 \cdot N + n}{2 \cdot N},$$

where $f_1$ is the frequency of the input signal, $f_2$ is the frequency of the output signal, N is the total number of delay elements in the ILO, and n is the number of delay elements by which the injection location is moved forward (i.e., from left to right in FIG. 2A) in each clock cycle. If the injection location is moved backward, then n is negative.

Figure 3A:
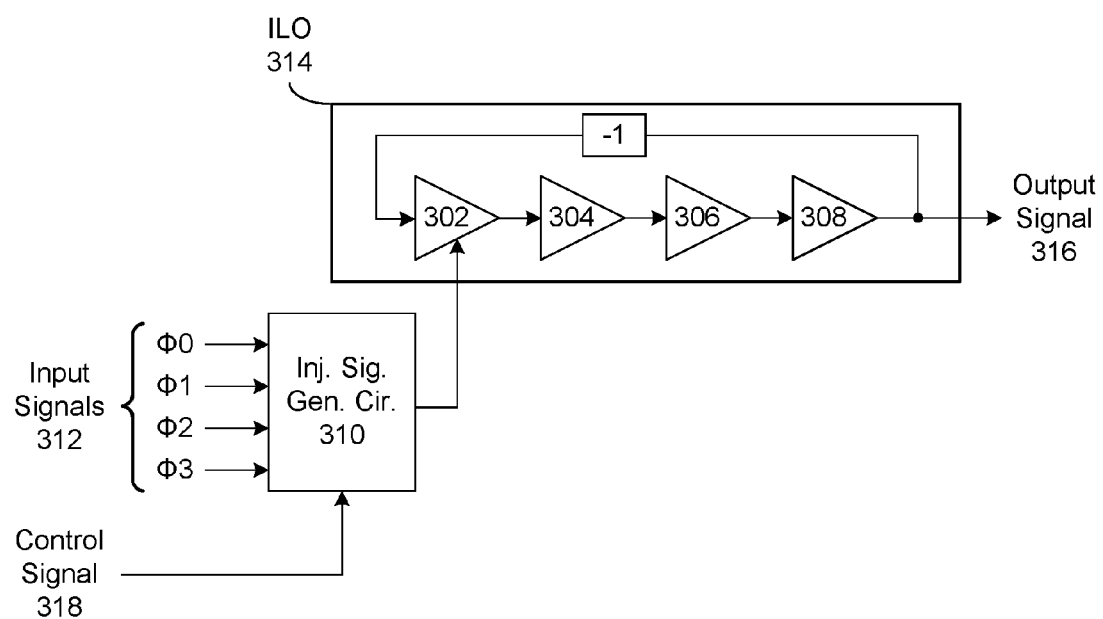
FIG. 3A illustrates circuitry capable of performing fractional clock multiplication by using an ILO in accordance with some embodiments described herein.

FIG. 3A illustrates circuitry capable of performing fractional clock multiplication by using an ILO in accordance with some embodiments described herein. FIG. 3A can correspond to an embodiment of fractional clock multiplication circuitry 102 shown in FIG. 1A.

ILO 314 includes four delay elements 302-308 that are arranged in a loop. The output of delay element 308 is provided as output signal 316. Injection signal generation circuitry 310 can receive input signals 312 which may include four copies of a master clock signal with different phases (shown as Φ0-Φ3). The output from injection signal generation circuitry 310 can be injected into one of the delay elements, e.g., delay element 302. Injection signal generation circuitry 310 can also receive control signal 318 that can be used to control the fractional clock multiplication ratio, i.e., the ratio between the frequency of input signals 312 and the frequency of output signal 316.

The embodiment illustrated in FIG. 3A can perform fractional clock multiplication by periodically changing the phase of the injection signal. For example, in successive clock cycles of input signal 312, injection signal generation circuitry 310 can inject an injection signal into delay element 302 that corresponds to phases Φ0, Φ1, Φ2, Φ3, and then wraps around to phase Φ0. In another example, injection signal generation circuitry 310 can alternate between phases Φ0 and Φ2. In yet another example, injection signal generation circuitry 310 can change the phase in reverse order, e.g., injection signal generation circuitry 310 can inject an injection signal into delay element 302 with phases Φ3, Φ2, Φ1, etc. in successive clock cycles.

Figure 3B:
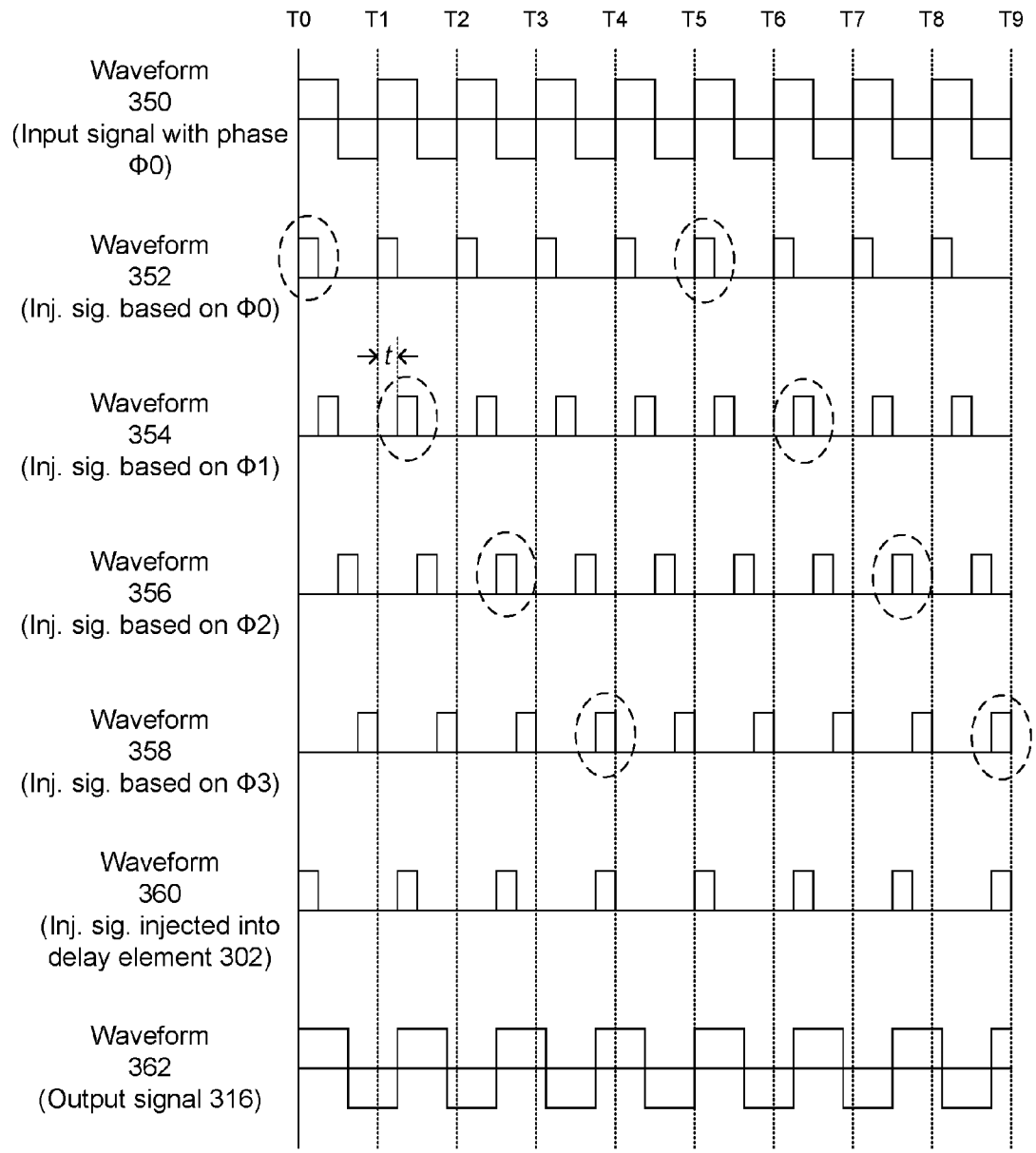
FIG. 3B illustrates some waveforms associated with the circuitry shown in FIG. 3A in accordance with some embodiments described herein.

FIG. 3B illustrates some waveforms associated with the circuitry shown in FIG. 3A in accordance with some embodiments described herein.

Waveform 350 can correspond to the input signal with phase Φ0. Waveforms 352, 354, 356, and 358 can correspond to the injection signals that are generated based on input signals 312 with phases Φ0, Φ1, Φ2, and Φ3, respectively. Waveform 360 can correspond to the injection signal that is injected into delay element 302. Waveform 362 can correspond to output signal 316.

Fractional clock multiplication can be achieved by periodically changing the phase of the injection signal. For example, the phase of the injection signal can be changed as follows: between time T0-T1, inject the injection signal based on Φ0 into delay element 302; between time T1-T2, inject the injection signal based on Φ1 into delay element 302; between time T2-T3, inject the injection signal based on Φ2 into delay element 302; between time T3-T4, inject the injection signal based on Φ3 into delay element 302; between time T4-T5, do not inject an injection signal; between time T5-T6, wrap around and inject the injection signal based on Φ0 into delay element 302; and so forth. The pulses that are injected into delay element 302 are highlighted in FIG. 3B using dashed ovals.

Waveform 360 shows the result of periodically changing the phase of the injection signal. Specifically, waveform 360 shows the timing of the pulses in the injection signal that is injected into delay element 302. The positive edges of waveform 362 (which corresponds to output signal 316) line up with the pulses in waveform 360. In this manner, a fractional clock multiplication ratio can be achieved between the frequency of input signals 312 and the frequency of output signal 316.

In some embodiments, the fractional clock multiplication ratio is given by $$\frac{f_2}{f_1} = \frac{T}{T+t},$$

where $f_1$ is the frequency of the input signal, $f_2$ is the frequency of the output signal, T is a clock period of the input signal (e.g., the time difference between time T0 and T1 in FIG. 3B), and t is the phase delay (e.g., the time difference between time T1 and the positive edge of the second pulse in waveform 354) that is added in each clock cycle. If a negative phase delay is introduced in each clock cycle, then t will be a negative value.

Figure 4A:
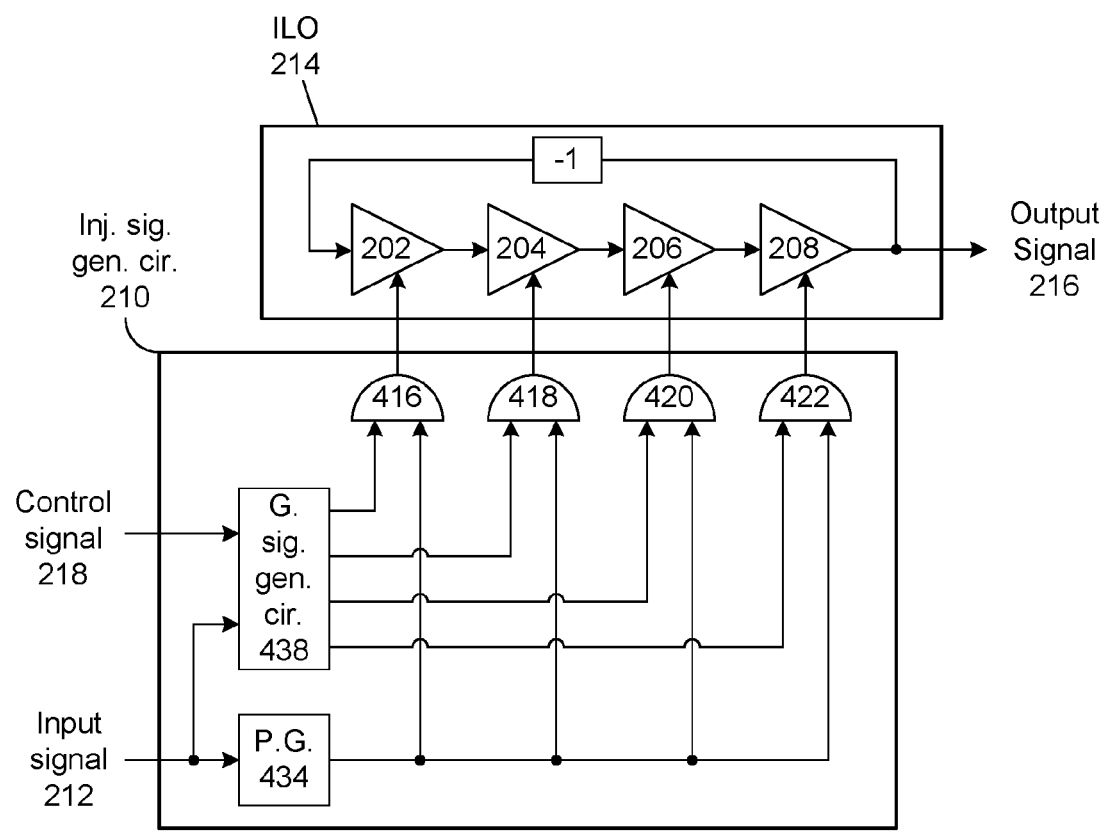
FIG. 4A illustrates circuitry capable of performing fractional clock multiplication by using an ILO in accordance with some embodiments described herein.

FIG. 4A illustrates circuitry capable of performing fractional clock multiplication by using an ILO in accordance with some embodiments described herein. Specifically, FIG. 4A provides further details of injection signal generation circuitry 210 shown in FIG. 2A.

Injections signal generation circuitry 210 can include gating signal generation circuitry 438, pulse generator 434, and gates 416-422. Input signal 212 can be provided as input to pulse generator 434 and gating signal generation circuitry 438. The output from pulse generator 434 can be provided as one of the inputs to gates 416-422. The outputs from the gating signal generation circuitry 438 can be provided as the other input to gates 416-422. The outputs from gates 416-422 can be injected into corresponding delay elements 202-208.

In some embodiments described herein, the injection signal from pulse generator 434 is injected into a delay element depending on the value of the corresponding gating signal. In these embodiments, the gating signal generation circuitry 438 can use its output signals to periodically change the location where the injection signal is injected into ILO 214. For example, to inject the injection signal into gate 202, gating signal generation circuitry 438 can provide a "1" signal to gate 416, and provide a "0" signal to gates 418-422.

Control signal 218 can be used to control the fractional clock multiplication ratio that is desired between input signal 212 and output signal 216. For example, gating signal generation circuitry 438 can use control signal 218 to determine how to move the injection location (e.g., forward or backward, and by how much).

Figure 4B:
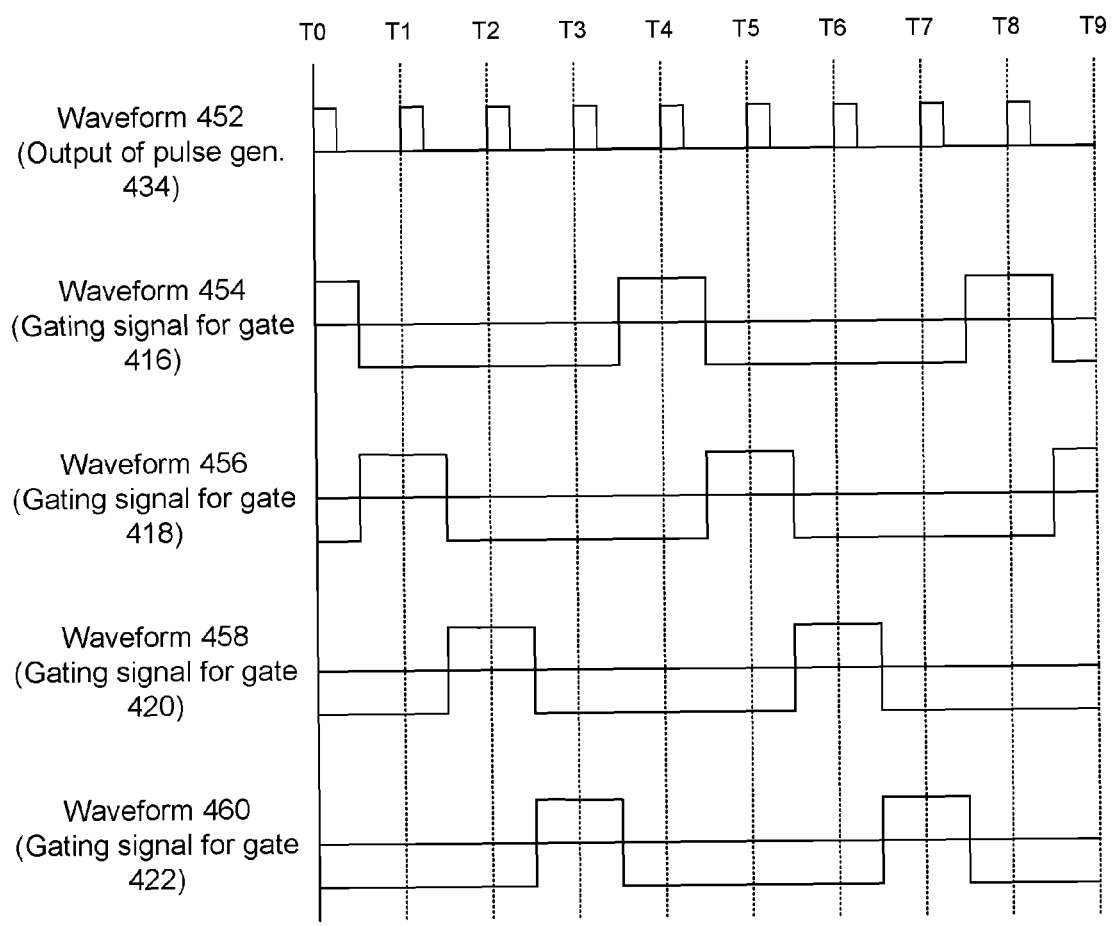
FIG. 4B illustrates some waveforms associated with the circuitry shown in FIG. 4A in accordance with some embodiments described herein.

FIG. 4B illustrates some waveforms associated with the circuitry shown in FIG. 4A in accordance with some embodiments described herein.

Waveform 452 can correspond to the output of pulse generator 434, and waveforms 454-460 can correspond to the gating signal that is provided to gates 416-422. Due to the timing relationship between the output of pulse generator 434 and the gating signals, the injection signal is injected as follows: the pulse at time T0 is injected into delay element 202 via gate 416; the pulse at time T1 is injected into delay element 204 via gate 418; the pulse at time T2 is injected into delay element 206 via gate 420; the pulse at time T3 is injected into delay element 208 via gate 422; the pulse at time T4 is injected into delay element 202 via gate 416; and so forth.

Figure 4C:
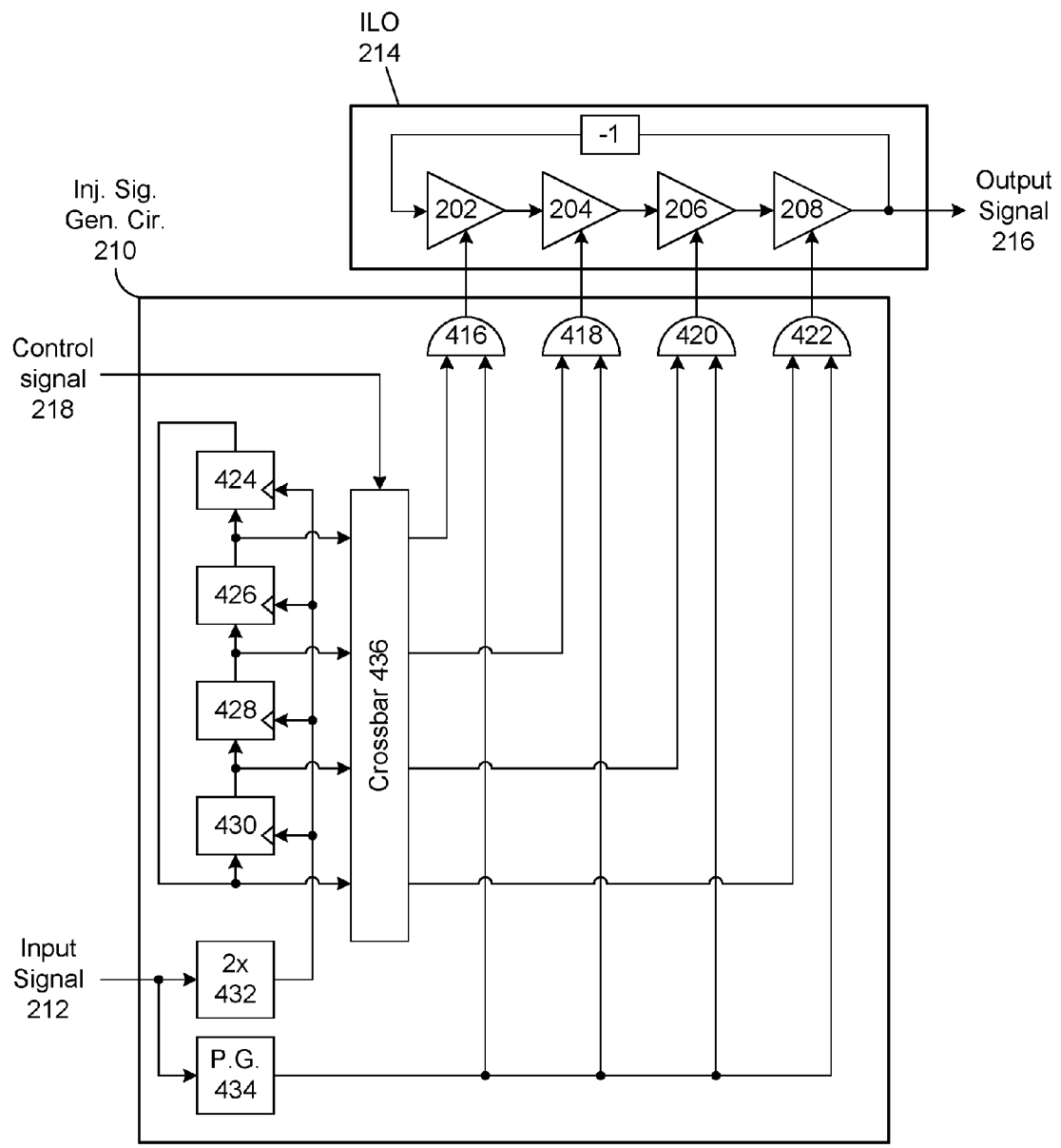
FIG. 4C illustrates circuitry capable of performing fractional clock multiplication by using an ILO in accordance with some embodiments described herein.

FIG. 4C illustrates circuitry capable of performing fractional clock multiplication by using an ILO in accordance with some embodiments described herein. Specifically, FIG. 4C provides further details of injection signal generation circuitry 210 shown in FIG. 2A.

Shift registers 424-430 can be arranged in a loop. Input signal 212 can be provided as input to pulse generator 434 and also to 2× clock multiplier 432. The output of 2× clock multiplier 432 can be provided as the clock signal to shift registers 424-430. The outputs of shift registers 424-430 can be provided as inputs to crossbar 436. The outputs from crossbar 436 can be provided as the gating signals to gates 416-422. Control signal 218 can be provided as a configuration input to crossbar 436. Crossbar 436 can be configured so that the injection location moves by a desired amount in a desired direction in each clock cycle.

In some embodiments, the gating signals shown in waveforms 454-460 in FIG. 4B can be generated as follows: (1) initialize shift registers 424-430 so that one of the shift registers, e.g., shift register 430 contains a "1" value, and the remaining shift registers contain a "0" value (note that when a clock signal is provided to the shift registers, the shift registers circulate the "1" value), and (2) configure crossbar 436 so that each input is passed through to the corresponding output.

Figure 4D:
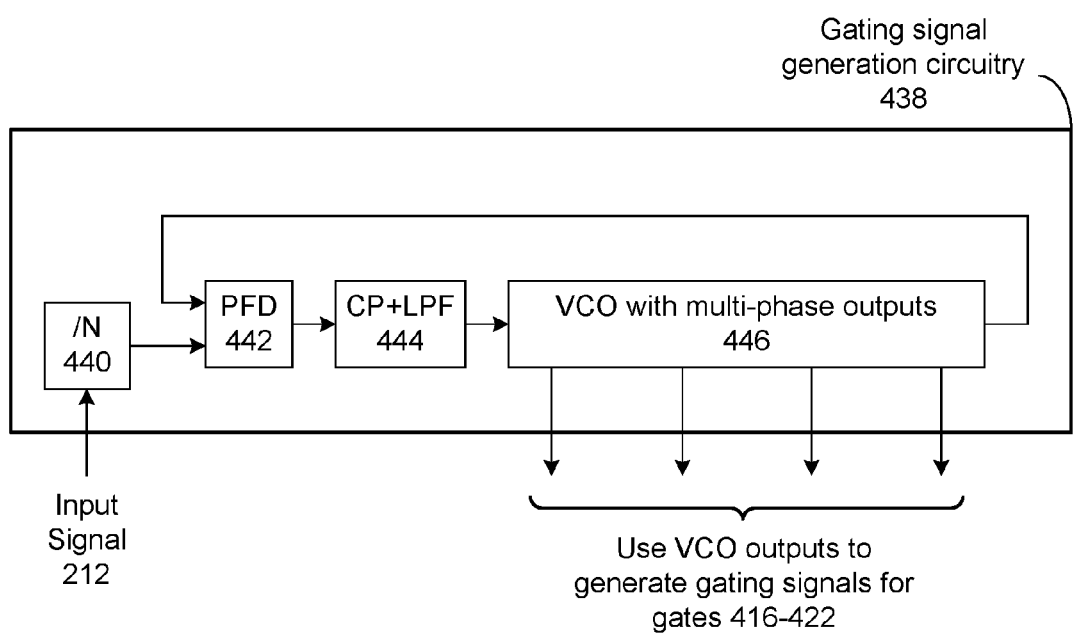
FIG. 4D illustrates circuitry for generating gating signals in accordance with some embodiments described herein.

FIG. 4D illustrates circuitry for generating gating signals in accordance with some embodiments described herein. Specifically, FIG. 4D provides further details of gating signal generation circuitry 438 shown in FIG. 4A.

In some embodiments described herein, the gating signals can be generated using a DLL. Gating signal generation circuitry 438 can include a divide by N circuit 440 (where N is the number of delay elements in the ILO for which gating signals are desired to be generated), a phase/frequency detector 442, charge pump and low-pass filter 444, and a voltage controlled oscillator (VCO) with multi-phase outputs 446.

The output signals of VCO with multi-phase outputs 446 can be used to generate gating signals for gates 416-422 shown in FIG. 4A. In some embodiments described herein, the duty cycles of the output signals of VCO with multi-phase outputs 446 can be adjusted to produce the gating signal waveforms 454-460 shown in FIG. 4B. In some embodiments described herein, two VCO outputs with different phases may be XORed together to generate a gating signal. In some embodiments described herein, the gating signals can be routed through a crossbar (similar to the configuration shown in FIG. 4C) before being provided to the gates. The crossbar can be configured so that the injection location moves by a desired amount in a desired direction in each clock cycle.

Figure 5A:
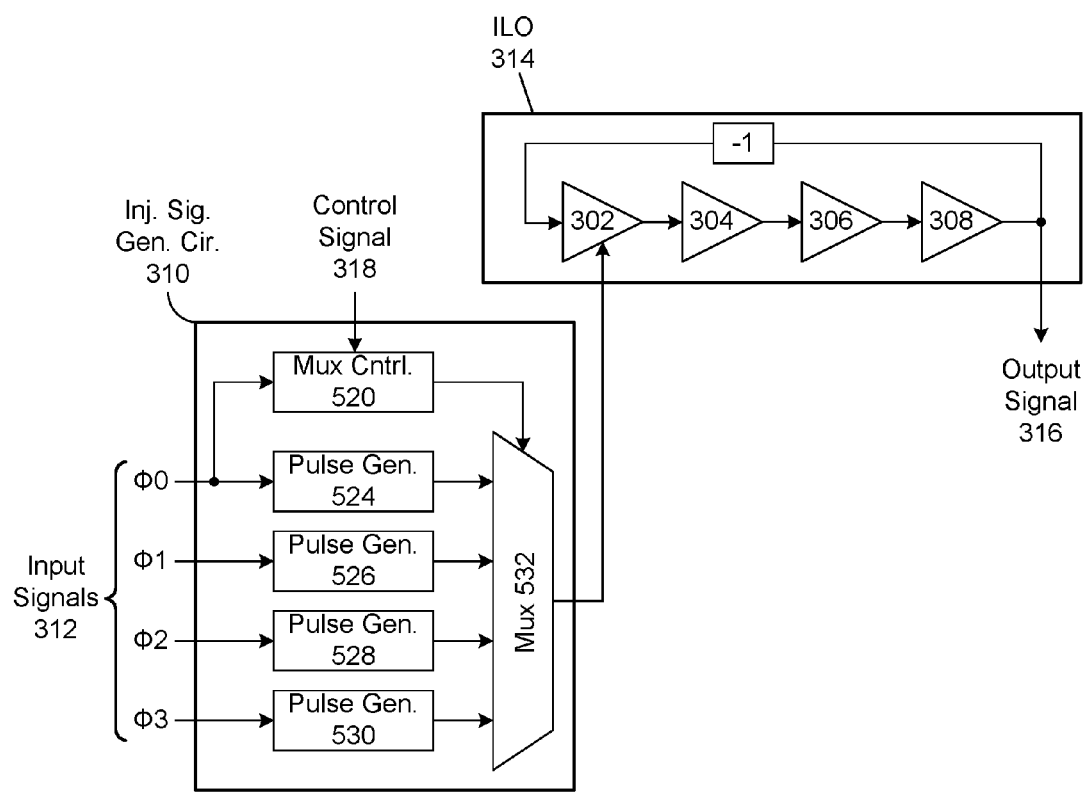
FIG. 5A illustrates circuitry capable of performing fractional clock multiplication by using an ILO in accordance with some embodiments described herein.

FIG. 5A illustrates circuitry capable of performing fractional clock multiplication by using an ILO in accordance with some embodiments described herein. Specifically, FIG. 5A provides further details of injection signal generation circuitry 310 shown in FIG. 3A.

Injection signal generation circuitry 310 can include pulse generators 524-530, multiplexer control circuitry 520, and multiplexer 532. Pulse generators 524-530 can receive input signals with phases $\Phi 0$-$\Phi 3$. The outputs from pulse generators 524-530 can be provided as inputs to multiplexer 532, and the output from multiplexer 532 can be provided as an injection signal to delay element 302.

Multiplexer control circuitry 520 can receive one of the input signals, e.g., the input signal with phase $\Phi 0$, and control signal 318, which can be used to control the fractional clock multiplication ratio. The output from multiplexer control circuitry 520 can be provided as a select signal to multiplexer 532. Multiplexer control circuitry 520 can periodically change the phase of the injection signal that is injected into delay element 302 by periodically changing the input signal (from the four input signals that are provided to multiplexer 532, as shown in FIG. 5A) that is selected by multiplexer 532.

Figure 5B:
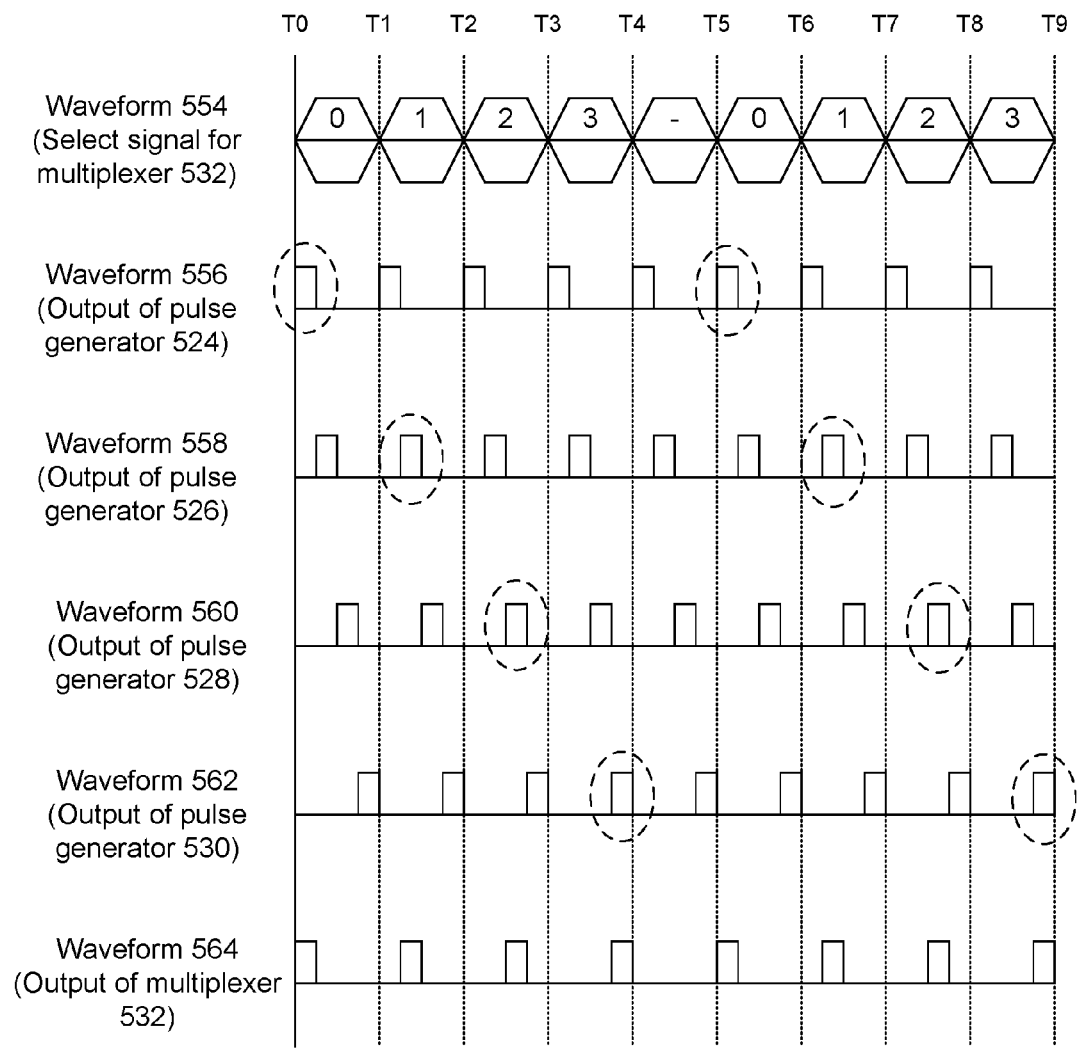
FIG. 5B illustrates some waveforms associated with the circuitry shown in FIG. 5A in accordance with some embodiments described herein.

FIG. 5B illustrates some waveforms associated with the circuitry shown in FIG. 5A in accordance with some embodiments described herein.

Waveforms 556-562 can correspond to the outputs from pulse generators 524-530. Waveform 554 can correspond to the select signal that is provided to multiplexer 532. The numbers inside waveform 554 indicate the multiplexer input that is selected by multiplexer 532. For example, the number "0" between time T0 and T1 indicates that input "0" of the multiplexer (which receives the input signal with phase $\Phi 0$) is coupled to the output during this time period. The dash symbol shown between time T4 and T5 indicates that none of the inputs of multiplexer 532 is selected during this time period (when none of the inputs is selected, a "0" value may be outputted by multiplexer 532).

Waveform 564 can correspond to the output of multiplexer 532. The output of multiplexer 532 can be provided as an injection signal to delay element 302, so that ILO 314 generates output signal 316 (which corresponds to waveform 362 shown in FIG. 3B).

Figure 6:
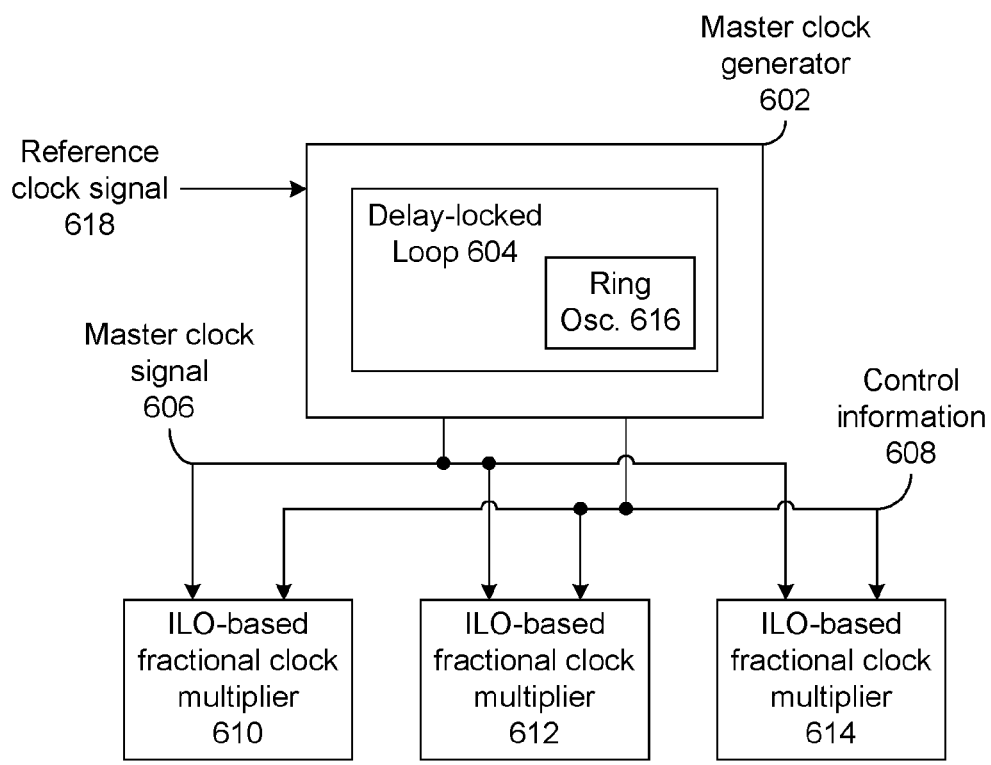
FIG. 6 illustrates how control information can be distributed in accordance with some embodiments described herein.

FIG. 6 illustrates how control information can be distributed in accordance with some embodiments described herein.

Master clock generator 602 can include DLL 604 that uses ring oscillator 616. The loop delay of ring oscillator 616 may change when operating conditions (e.g., voltage and/or temperature) change. DLL 604 can maintain a substantially constant frequency multiplication ratio between master clock signal 606 and reference clock signal 618 by continually adjusting the loop delay of ring oscillator 616 as the operating conditions change. The delay adjustment information (shown as control information 608 in FIG. 6) can be distributed by master clock generator 602 to other ILOs that are being used in fractional clock multiplication circuitries. For example, as shown in FIG. 6, master clock signal 606 and control information 608 (which includes the delay adjustment information) can be distributed to ILO-based fractional clock multipliers 610-614. The ILO-based fractional clock multipliers 610-614 can use control information 608 to adjust the loop delays of their ILOs, thereby ensuring that the natural oscillation frequency of the ILOs remains substantially constant even when operating conditions change.

Figure 7:
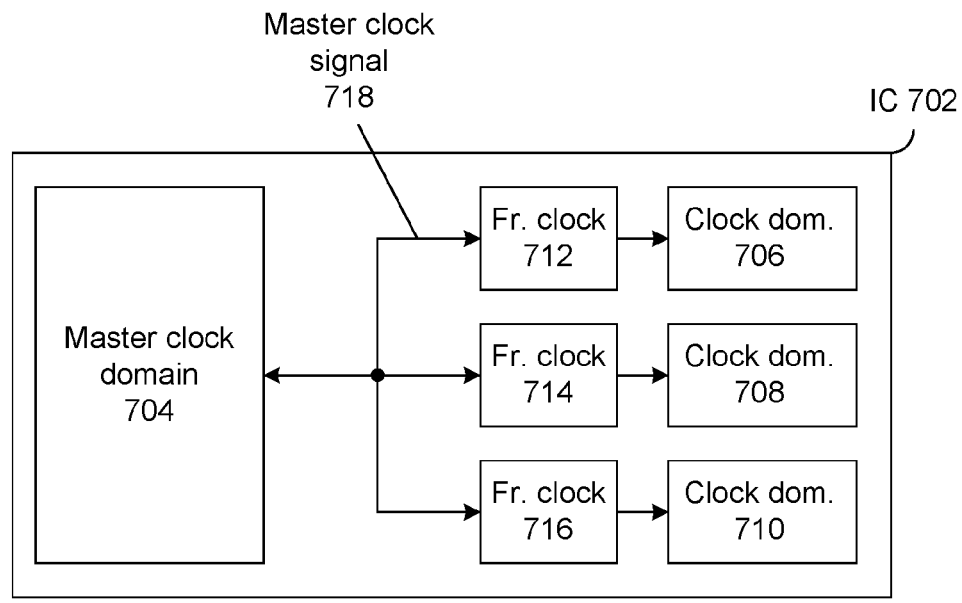
FIG. 7 illustrates an IC in accordance with some embodiments described herein.

FIG. 7 illustrates an IC in accordance with some embodiments described herein.

IC 702 may include multiple clock domains. Each clock domain can be operated using an independent clock signal. According to one definition, two clock signals are independent of each other if their frequencies can be modified independently of each other. According to one definition, a clock domain refers to a portion of an integrated circuit that operates based on a given clock signal.

In some embodiments described herein, IC 702 may include a master clock domain, e.g., master clock domain 704, and one or more other clock domains, e.g., clock domains 706-710. Master clock domain 704 may operate under master clock signal 718. Fractional clock multiplication circuitries 712-716 may be used to generate clock signals based on master clock signal 718 by using fractional clock multiplication. The clock signals generated by fractional clock multiplication circuitries 712-716 can then be provided to clock domains 706-710. Fractional clock multiplication circuitries 712-716 may receive separate control signals that may be used to independently change the frequencies of the clock signals in clock domains 706-710.

In some embodiments described herein, IC 702 may correspond to a processor, and clock domains 704-710 may correspond to different processing units within the processor. For example, master clock domain may include front-end processing circuitry, clock domain 706 may include circuitry for an arithmetic logic unit, clock domain 708 may include circuitry for a floating point unit, and clock domain 710 may include circuitry for a memory load/store unit. The processor may be capable of using the fractional clock multiplication circuitry corresponding to each clock domain to independently change the operating frequency of the clock domain.

Figure 8:
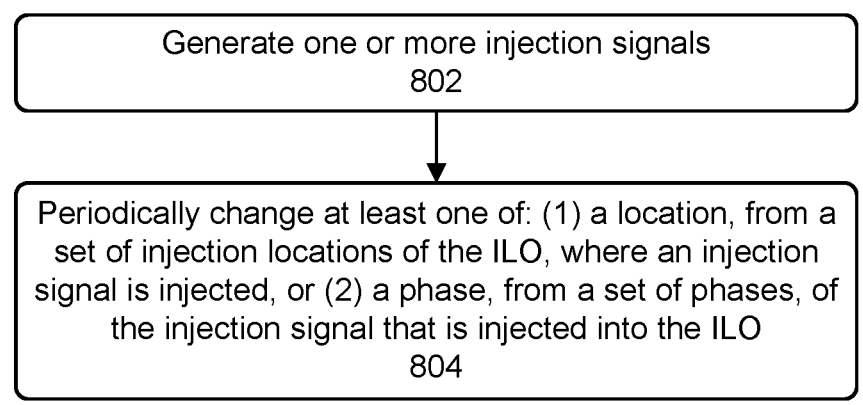
FIG. 8 presents a flowchart that illustrates a process for performing fractional clock multiplication using an ILO in accordance with some embodiments described herein.

FIG. 8 presents a flowchart that illustrates a process for performing fractional clock multiplication using an ILO in accordance with some embodiments described herein.

In some embodiments described herein, one or more injection signals may be generated (operation 802). Next, one of the following may be periodically changed: (1) a location, from a set of injection locations of the ILO, where an injection signal is injected, or (2) a phase, from a set of phases, of the injection signal that is injected into the ILO (operation 804).

The methods and/or processes that have been implicitly or explicitly described in this disclosure can be embodied in hardware, software, or a combination thereof. Hardware embodiments include, but are not limited to, IC chips, field-programmable gate arrays (FPGAs), and other programmable-logic devices now known or later developed.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. An integrated circuit, comprising:
an injection-locked oscillator (ILO) comprising a plurality of delay elements arranged in a loop, wherein the ILO comprises a plurality of injection locations, wherein each injection location in the plurality of injection locations corresponds to a delay element in the plurality of delay elements; and
an injection circuit to (1) choose different injection locations in the plurality of injection locations at different time instances, and (2) provide an injection signal to the chosen injection location in the plurality of injection locations.

2. The integrated circuit of claim 1, wherein the injection circuit comprises:
a plurality of gates, wherein an input of each gate receives the injection signal, and wherein an output of each gate is electrically coupled to a corresponding injection location in the plurality of injection locations; and
a gate-control circuit to provide (1) a first gating signal to a control input of a gate corresponding to the chosen injection location, thereby causing the injection signal to pass through the gate, and (2) a second gating signal to a control input of each gate corresponding to an injection location other than the chosen injection location, thereby causing the injection signal to be blocked at each gate corresponding to an injection location other than the chosen injection location.

3. The integrated circuit of claim 2, wherein the gate-control circuit comprises a plurality of shift registers arranged in a loop.

4. The integrated circuit of claim 3, wherein the gate-control circuit comprises a crossbar, wherein the outputs of the plurality of shift registers are electrically coupled to inputs of the crossbar, and wherein the outputs of the crossbar are electrically coupled to control inputs of the plurality of gates.

5. The integrated circuit of claim 2, wherein the gate-control circuit comprises a delay-locked loop having a plurality of output signals with different phases.

6. The integrated circuit of claim 5, wherein the gate-control circuit comprises a crossbar, wherein the plurality of output signals of the delay-locked loop are electrically coupled to inputs to the crossbar, and wherein the outputs of the crossbar are electrically coupled to control inputs of the plurality of gates.

7. The integrated circuit of claim 1, further comprising an injection-signal-generation circuit to (1) choose different clock signals at different time instances, wherein each clock signal has a different phase, and (2) output the chosen clock signal as the injection signal.

8. An integrated circuit, comprising:
a first clock domain comprising circuitry that is clocked based on a first clock signal;
a fractional clock multiplier to generate a second clock signal based on the first clock signal, the fractional clock multiplier comprising:
an injection-locked oscillator (ILO) comprising a plurality of delay elements arranged in a loop, wherein the ILO comprises a plurality of injection locations, wherein each injection location in the plurality of injection locations corresponds to a delay element in the plurality of delay elements; and
an injection circuit to (1) choose different injection locations in the plurality of injection locations at different time instances, and (2) provide an injection signal to the chosen injection location in the plurality of injection locations; and a second clock domain comprising circuitry that is clocked based on the second clock signal.

9. The integrated circuit of claim 8, wherein the injection circuit comprises:

a plurality of gates, wherein an input of each gate receives the injection signal, and wherein an output of each gate is electrically coupled to a corresponding injection location in the plurality of injection locations; and a gate-control circuit to provide (1) a first gating signal to a control input of a gate corresponding to the chosen injection location, thereby causing the injection signal to pass through the gate, and (2) a second gating signal to a control input of each gate corresponding to an injection location other than the chosen injection location, thereby causing the injection signal to be blocked at each gate corresponding to an injection location other than the chosen injection location.

10. The integrated circuit of claim 9, wherein the gate-control circuit comprises a plurality of shift registers arranged in a loop.

11. The integrated circuit of claim 10, wherein the gate-control circuit comprises a crossbar, wherein the outputs of the plurality of shift registers are electrically coupled to inputs of the crossbar, and wherein the outputs of the crossbar are electrically coupled to control inputs of the plurality of gates.

12. The integrated circuit of claim 9, wherein the gate-control circuit comprises a delay-locked loop having a plurality of output signals with different phases.

13. The integrated circuit of claim 12, wherein the gate-control circuit comprises a crossbar, wherein the plurality of output signals of the delay-locked loop are electrically coupled to inputs to the crossbar, and wherein the outputs of the crossbar are electrically coupled to control inputs of the plurality of gates.

14. The integrated circuit of claim 8, wherein the fractional clock multiplier comprises an injection-signal-generation circuit to (1) choose different clock signals at different time instances, wherein each clock signal has a different phase, and (2) output the chosen clock signal as the injection signal.

15. The integrated circuit of claim 8, wherein the integrated circuit is a processor, wherein the first clock domain comprises front-end processing circuitry, and wherein the second clock domain comprises one of: an arithmetic logic unit, a floating point unit, or a memory load/store unit.

16. An integrated circuit, comprising:

a master clock generator comprising a delay-locked loop and a ring oscillator, wherein the master clock generator outputs a first clock signal, wherein the master clock generator adjusts a loop delay of the ring oscillator so as to maintain a substantially constant frequency multiplication ratio between the first clock signal and a reference clock signal; and a fractional clock multiplier to generate a second clock signal based on the first clock signal, the fractional clock multiplier comprising:

an injection-locked oscillator (ILO) comprising a plurality of delay elements arranged in a loop, wherein a loop delay of the ILO is adjusted based on loop delay adjustment information received from the master clock generator, wherein the ILO comprises a plurality of injection locations, wherein each injection location in the plurality of injection locations corresponds to a delay element in the plurality of delay elements; and an injection circuit to (1) choose different injection locations in the plurality of injection locations at different time instances, and (2) provide an injection signal to the chosen injection location in the plurality of injection locations.

17. The integrated circuit of claim 16, wherein the injection circuit comprises:

a plurality of gates, wherein an input of each gate receives the injection signal, and wherein an output of each gate is electrically coupled to a corresponding injection location in the plurality of injection locations; and a gate-control circuit to provide (1) a first gating signal to a control input of a gate corresponding to the chosen injection location, thereby causing the injection signal to pass through the gate, and (2) a second gating signal to a control input of each gate corresponding to an injection location other than the chosen injection location, thereby causing the injection signal to be blocked at each gate corresponding to an injection location other than the chosen injection location.

18. The integrated circuit of claim 17, wherein the gate-control circuit comprises a plurality of shift registers arranged in a loop.

19. The integrated circuit of claim 17, wherein the gate-control circuit comprises a delay-locked loop having a plurality of output signals with different phases.

20. The integrated circuit of claim 16, wherein the fractional clock multiplier comprises an injection-signal-generation circuit to (1) choose different clock signals at different time instances, wherein each clock signal has a different phase, and (2) output the chosen clock signal as the injection signal.

* * * * *